United States Patent
Tanizaki et al.

(10) Patent No.: US 6,811,951 B2
(45) Date of Patent: Nov. 2, 2004

(54) PHOTOSENSITIVE CONSTITUENT FOR FLEXOGRAPHIC PRINTING PLATE

(75) Inventors: Akio Tanizaki, Shizuoka (JP); Hiroko Nakano, Shizuoka (JP); Naoyuki Onoda, Shizuoka (JP); Masaki Matsumoto, Shizuoka (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/979,070

(22) PCT Filed: May 23, 2000

(86) PCT No.: PCT/JP00/03294

§ 371 (c)(1),
(2), (4) Date: Nov. 16, 2001

(87) PCT Pub. No.: WO01/69319

PCT Pub. Date: Sep. 20, 2001

(65) Prior Publication Data

US 2003/0036017 A1 Feb. 20, 2003

(30) Foreign Application Priority Data

Mar. 16, 2000 (JP) ........................................ 2000-073508

(51) Int. Cl.[7] .............................. G03F 7/038; G03F 7/11
(52) U.S. Cl. ................................ 430/281.1; 430/270.1; 430/271.1; 430/285.1; 430/286.1; 430/287.1; 430/288.1; 101/453
(58) Field of Search .................... 430/270.1, 271.1, 430/281.1, 285.1, 286.1, 287.1, 288.1, 302, 306; 101/453, 463.1

(56) References Cited

U.S. PATENT DOCUMENTS

| | | | | |
|---|---|---|---|---|
| 4,045,231 A | | 8/1977 | Toda et al. ............... 96/115 |
| 4,197,130 A | * | 4/1980 | Nakamura et al. ........ 430/286.1 |
| 4,430,417 A | * | 2/1984 | Heinz et al. .............. 430/286.1 |
| 5,679,485 A | * | 10/1997 | Suzuki et al. ................. 430/18 |
| 5,863,704 A | * | 1/1999 | Sakurai et al. ............ 430/271.1 |
| 5,972,565 A | | 10/1999 | Dudek et al. ............. 430/287.1 |
| 6,025,098 A | * | 2/2000 | Sakurai et al. ................. 430/18 |
| 6,054,545 A | * | 4/2000 | Oshio et al. ................. 527/301 |
| 6,531,263 B2 | * | 3/2003 | Knoll ....................... 430/287.1 |

FOREIGN PATENT DOCUMENTS

| | | |
|---|---|---|
| EP | 0 337 442 A2 | 10/1989 |
| EP | 0 784 232 A1 | 7/1997 |
| EP | 0 786 700 A1 | 7/1997 |
| EP | 1 209 524 A1 * | 5/2002 ........... G03F/7/032 |
| JP | 63-70242 A | 3/1988 |
| JP | 2-46935 | 10/1990 |
| JP | 8-339085 | 12/1996 |
| WO | WO 96/10218 * | 4/1996 ........... G03F/7/032 |

* cited by examiner

Primary Examiner—Barbara Gilliam
(74) Attorney, Agent, or Firm—Birch, Stewart, Kolasch & Birch LLP

(57) ABSTRACT

A photosensitive constituent for a flexographic printing plate comprising a polyester film as support (B) and a photosensitive elastomer composition (C) and having an adhesive layer (A) therebetween, wherein the photosensitive elastomer composition (C) comprises, as essential components, (a) 50% by weight or more of at least one thermoplastic elastomer comprising a mono-vinyl-substituted aromatic hydrocarbon and a conjugated diene, (b) 5 to 40% by weight of at least one diene-based liquid rubber, (c) 1 to 20% by weight of at least one ethylenically unsaturated compound having 2 unsaturated bonds within its molecule, and (d) 0.1 to 3% by weight of at least one photopolymerization initiator, and wherein (1) the thermoplastic elastomer has an average ratio of vinyl bond units in conjugated diene segments thereof of 10 to 20 mol % and (2) the liquid rubber has a number average molecular weight (Mn) of 500 to 5,000 and an average ratio of vinyl bond units of 50 to 70 mol %.

5 Claims, No Drawings

PHOTOSENSITIVE CONSTITUENT FOR FLEXOGRAPHIC PRINTING PLATE

This application is the national phase under 35 U.S.C. § 371 of PCT International Application No. PCT/JP00/03294 which has an International filing date of May 23, 2000, which designated the United States of America.

TECHNICAL FIELD

This invention relates to a photographic constituent for a flexographic printing plate.

BACKGROUND ART

Photosensitive constituents for a flexograpic printing plate generally comprise a support such as a polyester film having provided thereon a photosensitive elastomer composition containing a thermoplastic elastomer, at least one ethylenically unsaturated compound and at least one radiation-responsive initiator. In addition, a thin film, often called a slip layer or a protective layer, is provided, if necessary, on the photosensitive layer for the purpose of smoothing contact with a negative film. In making a flexographic printing plate from such a photosensitive constituent for a flexographic printing plate, it is customary to conduct, first, UV radiation exposure all over the constituent through the support (back exposure) to thereby form a thin uniform cured layer, then to conduct imagewise exposure (relief exposure) of the photosensitive resin layer through a negative film and wash away unexposed areas with a developing solvent to thereby obtain a desired image, i.e., a relief image which is used as a printing plate.

In a printing process by which fine photographs or the like are printed, it is required to form extremely fine halftone dots or fine lines as a relief image, but, in such cases, it is not easy to prepare an adapted printing plate. For example, when relief exposure is conducted in a large exposure amount in order to form a fine relief image, it makes a reverse image (depressions) having a small depth which, upon printing, sometimes suffers the disadvantage of the spreading of ink and fails to enable reproduction of a distinct print.

In addition, there often occurs the failure that reproduction of halftone dots or fine lines becomes larger than the dimension of those in the negative film, which exerts detrimental influences on printing reproducibility.

On the other hand, when the amount of relief exposure is decreased so as to avoid such failure, photocuring of the relief image becomes insufficient, and hence chips are easily formed in some cases by pressure of a washing brush or the like in a developing step, and the intended image-forming properties are not obtained.

In addition, while most of dried printing plates after development have residual tackiness on the surface thereof, such tackiness remaining on the printing plate causes adhesion between the printing plates to each other and, when delaminating the plates from each other, the relief image in some cases is damaged or extraneous matter cannot be easily removed, which exerts detrimental influences on printing quality. In such cases, tackiness on the surface of the printing plates can be removed by employing the so-called post-exposure treatment of irradiating the dried printing plate with UV radiation of shorter wavelength as described in JP-B-2-46935 (The term "JP-B" as used herein means an "examined Japanese patent publication").

In this process, however, there is involved a complicated procedure of discreetly determining the amount of the UV radiation of shorter wavelength. Because, if the irradiation amount of the UV radiation is insufficient, the degree of surface tack is insufficiently decreased, whereas, if too much, there results such deteriorated physical properties of the surface of printing plate that a number of cracks are formed during the carrying of the plate or in the course of printing, with the print quality being diminished.

The obtained printing plate is fixed around a plate cylinder using a pressure sensitive double coated tape or by drawing a vacuum so as to be subjected to a printing step. However, there must not be delamination between the support and the cured resin due to shear stress between the plate cylinder and the impression cylinder during printing. In addition, while the printing plate is removed after completion of printing for storage and preparation for re-printing, it is necessary for the printing plate not to be broken and to firmly adhere to the support even when a large force is applied to the cured resin layer upon being removed by holding part of the cured resin layer.

For this purpose, good adhesion is necessary between the support and the photosensitive resin layer and, as a general guide, an adhesion force of 1 kg/cm or more is desirable when forcibly delaminated at an angle of 180 degrees. From this point of view, it has become customary to provide an adhesive layer between the support and the photosensitive resin layer to thereby strengthen adhesion between the support and the photocured resin layer.

In general, a polyester film constituting the support and the photosensitive layer mainly containing a rubber component differ greatly from each other in polarity, and hence it is extremely difficult to select an adhesive showing affinity for both.

In addition, even when an adhesive is selected which shows at least some affinity for each of them, the adhesive layer is in direct contact with the photosensitive layer, and hence components in the photosensitive resin layer migrate with time into the adhesive layer and, as a result, the properties of the adhesive are often inhibited.

When an initiator or a monomer in the photosensitive resin layer migrates into the adhesive layer, the problem exists that the monomer causes polymerization in the adhesive layer as well in the exposing step, leaving curing contraction stress which may cause delamination at the interface between the support and the adhesive layer.

Accordingly, the adhesion force between the support and the photosensitive resin layer depends upon a combination of the compositions of the two and, in order to obtain a strong adhesion force, sufficient consideration must be given to this.

However, it has been difficult to find a combination of a photosensitive resin layer, an adhesive and a support, where the photosensitive resin layer exhibits excellent mechanical properties and relief-reproducing properties and yet retains strong adhesion to a support.

An object of the present invention is to provide a photosensitive constituent for a flexographic printing plate which shows good capabilities of forming extremely fine halftone dots and providing good printing quality in process printing, which enables the tackiness of the printing plate to be easily removed through post-exposure treatment, which avoids formation of cracks in the printing plate surface, in which adhesion force between the photosensitive resin layer and its support of a polyester film is strong enough not to cause any trouble under actual printing conditions, and which is stable with time.

DISCLOSURE OF THE INVENTION

As a result of extensive investigations, the inventors have found that the above objects can be achieved by using the following novel photosensitive elastomer composition in the photoconductive constituent for a flexographic printing plate, thus resulting in the present invention.

That is, the present invention provides a photosensitive constituent for a flexographic printing plate comprising a polyester film as support (B) and a photosensitive elastomer composition (C) and having an adhesive layer (A) therebetween, wherein the photosensitive elastomer composition (C) comprises, as essential components, (a) 50% by weight or more of at least one thermoplastic elastomer comprising a mono-vinyl-substituted aromatic hydrocarbon and a conjugated diene, (b) 5 to 40% by weight of at least one diene-based liquid rubber, (c) 1 to 20% by weight of at least one ethylenically unsaturated compound having 2 unsaturated bonds within its molecule, and (d) 0.1 to 3% by weight of at least one photopolymerization initiator, and wherein (1) the thermoplastic elastomer has an average ratio of vinyl bond units in conjugated diene segments thereof of 10 to 20 mol % and (2) the liquid rubber has a number average molecular weight (Mn) of 500 to 5,000 and an average ratio of vinyl bond units of 50 to 70 mol %.

BEST MODE FOR CARRYING OUT THE INVENTION

The thermoplastic elastomer used in the present invention in a content of 50% by weight or more, is obtained by polymerizing a mono-vinyl-substituted aromatic hydrocarbon monomer and a conjugated diene monomer. Styrene, α-methylstyrene, p-methylstyrene, p-methoxystyrene or the like is used as the mono-vinyl-substituted aromatic hydrocarbon, and butadiene, isoprene or the like is used as the conjugated diene monomer. Typical examples of the elastomer include styrene-butadiene-styrene block copolymer, styrene-isoprene-styrene block copolymer, etc. As to the content of the mono-vinyl-substituted aromatic hydrocarbon in the thermoplastic elastomer, a range of 8 to 40% by weight is preferred. If the content is too low, cold flow of the photosensitive elastomer composition results, and a good thickness is not obtained. If too high, the hardness of the resulting flexograpic printing plate becomes too high, and good printing quality is not obtained.

Vinyl bond units in the conjugated diene segments of the thermoplastic elastomer contribute to improvement of reproducibility of a relief but, at the same time, they can be the cause of increasing tackiness of the surface of the flexographic printing plate. From the standpoint of balancing these two properties, the average ratio of vinyl bond units is required to be 10 to 20%, preferably 12 to 20%, more preferably 14 to 20%. The term "average ratio of vinyl bond units" as used herein means, in the conjugated diene segments using, for example, butadiene which segments include 1,2-bond segments and 1,4-bond segments, an average ratio of side chain-vinyl group-containing segments generated from the 1,2-bond based on the mol number of the total butadiene used.

The average content of mono-vinyl-substituted aromatic hydrocarbon and the conjugated diene can be determined by calculating the content of the mono-vinyl-substituted aromatic hydrocarbon. In the case of, for example, styrene-butadiene type elastomers, it can be determined according to Hampton method using IR spectrum. In the case of styrene-isoprene elastomers, it can be determined from the following formula, in which C represents an area of peak signal at 6.3 to 7.3 ppm in $H^1$-NMR spectrum originating from hydrogen on the benzene ring, and D represents the total area:

$$\text{Average content of styrene (mol\%)} = Sm = 100 \times (8/5) \times (C/D)$$

$$\text{Average content of styrene (\% by weight)} = 100 \times \frac{104 \times Sm}{104 \times Sm + 68 \times (100 - Sm)}$$

Further, in the case of, for example, styrene-butadiene type elastomers, the average ratio of vinyl bond units in the conjugated diene segment of the thermoplastic elastomer is determined from IR spectrum of a 1% solution in carbon disulfide according to Hampton method described in Anal. Chem., 21, 923 (1949). In the case of styrene-isoprene type elastomers, it is determined from the following formula wherein A represents an area of peak signal at around 4.7 ppm in $H^1$-NMR spectrum originating from the vinyl bond, and B represents an area of peak signal at around 5.1 ppm originating from 1,4-bond:

$$\text{Average ratio of vinyl bond units (mol \%)} = 100 \times A/(A+2B)$$

Additionally, in conducting these analyses on the photosensitive elastomer composition, the thermoplastic elastomer alone must be separated before the analyses.

The thermoplastic elastomer to be used in the present invention can be obtained by the process described in, for example, JP-A-63-27573 (corresponding to U.S. Pat. No. 4,792,584)(The term "JP-A" as used herein means an "unexamined published Japanese patent application"). That is, the content of the mono-vinyl-substituted aromatic hydrocarbon can be adjusted to be within the scope of the present invention by controlling the amount thereof.

In addition, the ratio of the vinyl bond units of the conjugated diene can be adjusted by using a polar compound as a vinylating agent in the polymerizing process in a hydrocarbon solvent using an organic lithium compound as an initiator, and controlling the reaction through the kind and amount of the polar compound, polymerization temperature, and the like.

As the hydrocarbon solvent to be used in the polymerization, there may be used aliphatic hydrocarbons such as butane, pentane, hexane, isopentane, heptane, octane and isooctane; alicyclic hydrocarbons such as cyclopentane, methylcyclopentane, cyclohexane and methylcyclohexane; and aromatic hydrocarbons such as benzene, toluene and xylene. The organic lithium compound may be, for example, ethyl lithium, propyl lithium, butyl lithium, hexamethylene dilithium, etc.

Further, exemplary polar compounds to be added for adjusting vinyl bond content, include ethers such as tetrahydrofuran, diethylene glycol dimethyl ether, diethylene glycol dibutyl ether, etc.; amines such as triethylamine, tetramethylethylenediamine, etc.; thioethers; phosphines; alkylbenzenesulfonates; potassium or sodium alkoxides; and the like.

As the diene-based liquid rubber in the present invention, liquid polybutadiene, polyisoprene or the like having a number average molecular weight of 500 to 5,000 is used in an amount of 5 to 40% by weight based on the total amount of the photosensitive composition. In cases when the ratio of the liquid rubber is more than the above range, the resulting elastomer composition becomes soft, thus lacking dimensional stability at room temperature whereas, in cases when less than the above range, an insufficient plastic effect results, and flexibility of the resulting flexographic printing plate becomes insufficient. Thus, the liquid rubber is required to be present in the above-described range.

As to the average ratio of vinyl bond units in the liquid rubber, it must be in the range of from 50 to 70 mol %. If too low, it is detrimental to the reproduction of a relief image whereas, if too high, the photocured resin is so fragile that the resulting relief is liable to be chipped. The ratio of vinyl bond units can be determined according to the Hampton method or the $H^1$-NMR method as is the same with the thermoplastic elastomer.

Further, exemplary ethylenically unsaturated compounds having 2 unsaturated bonds include esters between a dihydric alcohol and acrylic acid or methacrylic acid such as butanediol di(meth)acrylate, hexanediol di(meth)acrylate, nonanediol di(meth)acrylate, ethylene glycol di(meth) acrylate, polyethylene glycol di(meth)acrylate, bisphenol A ethylene oxide adduct di(meth)acrylate and bisphenol A propylene oxide adduct di(meth)acrylate; reaction products between diisocyanate such as hexamethylenediisocyanate or trilenediisocyanate and a methacrylic or acrylic acid derivative having a hydroxyl group or an amino group in the side chain; and the like. Such compounds may be used alone or in combination, in a range of 1 to 20% by weight in the photosensitive elastomer composition.

In particular, when the ethylenically unsaturated compound includes a compound represented by formula (1), there exist the advantages that high exposure sensitivity can be obtained which enables relief exposure time to be shortened, and extremely fine halftone dot-forming properties result with corresponding print reproducibility with high quality being obtained.

Formula (1):

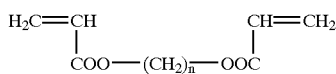

$n = 9$ to $16$

The photoinitiator employed in the present invention may be selected from among known photopolymerization initiators including aromatic ketones like benzophenone, benzoin methyl ether, benzoin ethyl ether, benzoin propyl ether, α-methylol benzoin methyl ether, α-methoxybenzoin methyl ether, 2,2-diethoxyphenylacetophenone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butanone-1, etc. Combinations of the above photoinitiators may be used. The photoinitiator may be used in an amount in a range of from 0.1 to 3.0% by weight.

Of these initiators, a combination of initiators of 2,2-dimethoxy-1,2-diphenylethan-1-one and 2-methyl-1-[4-(methylthio)phenyl]-2-morpholinopropan-1-one or 2-benzyl-2-dimethylamino-1-(4-morpholinophenyl)-butanone-1 serves, when used, to form a relief having a cross-sectional shape nearer to perpendicularity and reduces dot gain upon printing. In addition, there are advantages that tackiness reduction after post-exposure treatment is improved and that the surface suffers little formation of cracks, with durability being improved.

The photosensitive elastomer composition of the present invention may further contain, as additional compounds, additives such as a thermal polimerization inhibitor, a plasticizer, a colorant, etc. depending upon required properties.

As the composition of the adhesive layer, there may be used, for example, a composition prepared by compounding a multi-functional isocyanate with a mixture of a thermoplastic elastomer obtained by polymerization between the mono-vinyl-substituted aromatic hydrocarbon monomer and the conjugated diene monomer and polybutadiene part of which is modified with hydroxyl group or carboxyl group; a composition of a reaction product between a mixture comprising a high molecular compound having an urethane or ester structure and a hydroxyl group-containing ethylenically unsaturated compound and a multi-functional isocyanate; and the like.

A particularly preferred adhesive is a reaction product between a mixture comprising polyol having a polyester structure, a polyurethane structure or both of the structures and a hydroxyl group-containing ethylenically unsaturated compound and a multi-functional isocyanate.

The polyol having a polyester structure is obtained by polycondensation reaction between a diol component and a dicarboxylic acid component, with the diol component being employed in an excess. As the diol component, diols having a skeleton of a straight and branched aliphatic saturated hydrocarbon, bisphenol A, a diol having a structure of an ethylene oxide adduct of bisphenol A, polyoxyalkylene glycols, and mixtures of these diols may be used. On the other hand, as the dicarboxylic acid component, dicarboxylic acids having a skeleton of a straight and branched aliphatic saturated hydrocarbon, terephthalic acid, isophthalic acid, and mixtures of these dicarboxylic acid components may be used.

In addition, the polyol having a polyurethane structure can be obtained by polyaddition reaction between a diol component as described above and a diisocyanate compound, with the diol component being in an excess amount.

The polyol having the structure of both polyester and polyurethane can be obtained by charging an excess amount, based on the diisocyanate compound, of a previously synthesized polyol having a polyester structure to react.

Further, exemplary ethylenically unsaturated compounds containing a hydroxyl group, include, for example, 2-hydroxyethyl (meth)acrylate, 2-hydroxypropyl (meth)acrylate, 2-hydroxybutyl (meth)acrylate, 2-hydroxy-3-acryloyloxypropyl (meth)acrylate), 2-hydroxy-3-phenoxypropyl (meth)acrylate, and the like.

The adhesive layer between the support and the photosensitive resin layer can be obtained by dissolving a reaction product between a mixture of the above-described polyol and the ethylenically unsaturated compound containing a hydroxyl group and the multi-functional isocyanate in a suitable solvent, and coating the solution, followed by drying.

Here, if the molecular weight of the polyol is too low, the reaction product thereof with the multi-functional isocyanate has such a high degree of tackiness that handling properties after coating on a support suffer. On the other hand, from the point of view of reactivity of the multi-functional isocyanate, if the molecular weight of the polyol is too high, there results a disadvantage that the urethanating reaction becomes slow. Thus, the number average molecular weight of the polyol is preferably 10,000 to 100,000 in terms of polystyrene according to gel permeation chromatography.

Exemplary multi-functional isocyanates include tolylene diisocyanate, 4,4-diphenylmethane diisocyanate, xylylene diisocyanate, hexamethylene diisocyanate, those compounds which are prepared by addition reaction between these multi-functional isocyanates and multi-functional alcohols such as pentaerythritol and trimethylolpropane, with the multi-functional isocyanates being employed in excess.

Coating of the adhesive onto the support can be conducted, for example, in the following manner. That is, an adhesive comprising a mixture of 100 parts of the polyol component and 1 to 30 parts of the ethylenically unsaturated compound containing a hydroxyl group and 1 to 30 parts of the multi-functional isocyanate are dissolved in an organic solvent such as ethyl acetate, methyl ethyl ketone, tetrahydrofuran or toluene or a mixture thereof, uniformly coated on a support of polyester film, then dried at 80 to 100° C. for several seconds (e.g. ten seconds) to several minutes to form an adhesive layer. In this occasion, a UV absorbent, a dye, and the like may be added to the adhesive layer as the case demands for the purpose of imparting antihalation effect. The amount of the adhesive after drying is usually 5 to 30 g/m². Thereafter, in order to force the urethanation reaction to proceed in the adhesive layer, it is left at 40 to 50° C. for several days.

In cases when a highly adhesive coating is additionally provided on the surface of the support of polyester film on which surface is to be coated the adhesive, the adhesion force between the adhesive layer and the support becomes stronger, resulting in a more preferred constituent for a flexographic printing plate.

The highly adhesive coating is usually laminated during the steps of producing the polyester film, which is more advantageous in comparison with the case of providing an adhesive subbing layer in an off-line manner in view of production cost and stability of quality.

As such polyester films having laminated on the highly adhesive coating, various ones are commercially available for various coating materials and inks, and a proper one effective in the present invention as well may be selected from among them.

As examples of the commercially available polyester films having laminated thereon a highly adhesive coating, there are illustrated Lumilar T90 series or Q80 series made by Toray Co., Ltd., Cosmoshine A4000 series made by Toyobo K.K., Tetron HPE and SG2 made by Teijin Co., Ltd., Merinex 700 series made by E. I. du Pont de Nemours & Co. Inc., and the like.

The photosensitive constituent of the present invention for a flexographic printing plate may be prepared by various methods. For example, starting materials of the photosensitive elastomer composition are dissolved in a suitable solvent such as chloroform, tetrachloroethylene, methyl ethyl ketone or toluene to be mixed, then cast into a frame, followed by evaporating the solvent to form a plate. Alternatively, the constituent may be formed by kneading in a kneader or a roll mill without using any solvent, and forming as a plate with a desired thickness on a support using an extruder, an injection molding machine, a press or the like.

Since the photosensitive elastomer composition usually has some tackiness, a thin film of polyethylene, polypropylene, polyester, polystyrene or the like is laminated on the surface of the resin layer in order to improve contact properties with a transparent image carrier to be superposed thereon upon plate making or permit re-use of a negative film. This film will be delaminated after completion of exposure through a negative film superposed thereon.

For the same purpose, a solvent-soluble, thin, flexible protective layer (see, for example, JP-B-5-13305) may be provided in place of the film. In addition, this flexible layer may be made into a UV radiation-blocking layer containing an infrared radiation-sensitive substance, and subjected to direct imagewise irradiation with an infrared laser so that this flexible layer itself may be used as a negative. In both cases, this thin, flexible, protective layer is removed simultaneously by washing away unexposed areas after completion of the exposure.

In the case of providing the solvent-soluble, thin, flexible protective layer such as a layer of polyamide, partially saponified polyvinyl acetate, cellulose ester or the like soluble in a wash-out solution on the surface of the photosensitive resin layer, this may be solved in a proper solvent, followed by directly coating the solution onto the photosensitive resin layer. Alternatively, it may be coated on a film of polyester, polypropylene or the like (to form a protective film), then this protective film transferred to the photosensitive layer by lamination or press bonding.

A photosensitive elastomer layer having the desired thickness can be obtained by bringing, after formation of the sheet of the photosensitive resin composition, the protective film or the support into close contact with the photosensitive elastomer composition by roll lamination, followed by heat-pressing.

Exemplary sources of UV radiation to be used for photocuring the photosensitive elastomer layer, include a high pressure mercury lamp, a UV ray fluorescent lamp, a carbon arc lamp, a xenon lamp, sunlight, and the like.

A desired relief image can be obtained by exposing the photosensitive elastomer layer with UV radiation through a negative film and, in order to obtain a relief image having greater stability against pressure to be applied to the cured layer upon wash out of uncured areas, it is effective to conduct all-over exposure from the support side. Either the exposure from the negative film side or the exposure from the support side may be conducted first, or both exposures may be conducted at the same time but, from the standpoint of view of image reproducibility, it is preferred to first conduct the exposure from the support side.

Exemplary developing solvents to be used for washing out unexposed areas after formation of an image by irradiating the photosensitive resin layer with UV radiation through a transparent image carrier, include esters such as heptyl acetate and 3-methoxybutyl acetate, petroleum fraction, hydrocarbons such as toluene and decalin, and a mixture of a chlorine-containing organic solvent such as tetrachloroethylene and an alcohol such as propanol, butanol or pentanol. Wash out of unexposed areas is conducted by jetting through a nozzle or brushing with a brush. The thus obtained printing plate is rinsed, dried, and subjected to irradiation of the surface with light of 300 nm or less in wavelength, followed by, if necessary, post exposure treatment with light of more than 300 nm, to finish.

The present invention will be illustrated in greater detail with reference to the following Examples.

EXAMPLES 1 TO 3 AND COMPARATIVE EXAMPLES 1 AND 2

(1) Preparation of Photosensitive Elastomer Composition:

As thermoplastic elastomer, those which were synthesized according to the process described in JP-A-63-27573 and shown in Table 1 were used. In addition, "%" represents "% by weight" unless otherwise indicated.

TABLE 1

| Type of thermoplastic elastomer | Content of Styrene | Content of Vinyl |
| --- | --- | --- |
| A Styrene-butadiene-styrene | 40% | 13 mol % |
| B Styrene-butadiene-styrene | 22% | 30 mol % |
| C Styrene-butadiene-styrene | 24% | 12 mol % |
| D Styrene-isoprene-styrene | 14% | 8 mol % |

Photosensitive resin compositions were prepared by combining the thermoplastic elastomers of Table 1 so that the weight ratio of the elastomers was 60% as shown Table 2 to be shown hereinafter, employing as other components 29% of liquid polybutadiene (B-2000, made by Nihon Sekiyu Kagaku) having a number average molecular weight of 2000 and a vinyl content of 65 mol %, 5% of dioctyl fumarate, 2% of N-laurylmaleimide, 2% of alkane diol diacrylate (carbon number of diol component: 14 to 16), 1.7% of 2,2-dimethoxy-1,2-diphenylethan-1-one and 0.3% of 2,6-di-t-butyl-p-cresol, and kneading them in a kneader.

(2) Preparation of Support:

624 g of neopentyl glycol, 93 g of ethylene glycol, 485 g of sebacic acid and 382 g of isophthalic acid were reacted in an aerial atmosphere at a reaction temperature of 180 C. under a reduced pressure of 10 mmHg for 6 hours, then 87 g of tolylene diisocyanate was added thereto, followed by reacting at 80° C. for 5 hours. Number average molecular weight of the obtained polyol was measured by the gel permeation chromatography to be about 32,000 in terms of polystyrene.

A mixture of 100 parts of this polyol and 2 parts of 2-hydroxypropyl methacrylate and 17 parts of an adduct between trimethylolpropane (1 mol) and tolylenediisocyanate (3 mols) were added to 300 parts of ethyl acetate to prepare a uniform solution, and coated on a polyester film, A4100, having a thickness of 125 μm and made by Toyobo K.K. in a dry amount of 10 to 14 g/m² using a knife coater. This was dried at 80° C. for 2 minutes, then left in a 40° C. atmosphere for 3 days to obtain a support having an adhesive layer.

(3) Preparation of Photosensitive Constituent for Flexographic Printing Plate and Production of Printing Plate:

The photosensitive elastomer composition prepared in (1) was sandwiched between the support prepared in (2) and a 100-μm thick polyester cover sheet having a 4- to 6-μm thick ethyl cellulose layer. A pressure of 200 kg/cm² was applied thereto at 130° C. for 4 minutes by a press using a 3-mm spacer to form a photosensitive constituent for a flexographic printing plate.

The cover sheet of the obtained phosotensitive consititu-ent for a flexographic printing plate was delaminated, a negative film was brought into close contact with the protective layer of ethyl cellulose provided on the photosensitive resin layer, all-over exposure of 300 mJ/cm² was first conducted from the support side on an exposing machine AFP-1500 (manufactured by Asahi Kasei Kogyo) using a UV radiation fluorescent lamp emitting light of 370 nm in central wavelength, then imagewise exposure of 9,000 mJ/cm² was conducted through a transparent image carrier. Exposure intensity upon this was measured by means of a UV illuminometer model MO-2 made by Oak Seisakusho using a UV-35 filter: Intensity of UV radiation from the lamp on the lower side from which the back exposure was conducted was measured to be 4.0 mW/cm² on the glass plate, and intensity of UV radiation from the lamp on the upper side from which the relief exposure was conducted was measured to be 7.8 mW/cm². Subsequently, development was conducted at a liquid temperature of 25° C. by means of a developing machine Quick Line 912 (made by Asahi Kasei Kogyo) using Solvit (made by Polyfibron) as a developing solution, followed by drying at 60° C. for 1 hour.

Thereafter, the whole surface was exposed in an exposure amount of 1,200 mJ/cm using a sterilization lamp emitting light of 254 nm in central wavelength, then post-exposed using a UV radiation fluorescent lamp in an exposure amount of 1,000 mJ/cm². Additionally, the amount of poxt exposure using the sterilization lamp was calculated from the illuminance measured using a UV-25 filter of the MO-2 machine.

The results of evaluating the thus obtained printing plates are shown in Table 2.

TABLE 2

|  | Combination of Elastomers | Average Vinyl Bond Units in Diene Segment(mol %) | Formability of Halftone Dots | Tacky Feeling on Plate Surface | Printing Reproducibility of Dots, Fine Lines and Reverse Areas |
|---|---|---|---|---|---|
| Example 1 | A 45%, B 15% | 18.1 | 1%-150 lines/inch | no | good |
| Example 2 | B 20%, D 40% | 14.5 | 1%-150 lines/inch | no | good |
| Example 3 | C 60% | 12.0 | 1%-150 lines/inch | no | good |
| Comparative Example 1 | D 60% | 8.0 | 3%-120 lines/inch | no | Reproduction of dots were limited. |
| Comparative Example 2 | A 30%, B 30 | 24.3 | 1%-150 lines/inch | yes | good |

As is shown in Table 2, as to the thus obtained flexographic printing plates of Examples 1 to 3, extremely fine halftone dots of 1%-150 lines were formed, shoulder of the relief was almost perpendicular, and printing reproducibility of halftone dots, fine lines, reverse areas, and the like was good as well. In addition, the printing plates did not give a tacky feeling and, even when extraneous material adhered to the surface, it was easily removable. Further, when printing on the polyethylene film was conducted using an ink containing about 15 vol % of an acetic acid ester, delamination between the support and the cured resin layer due to shear stress between the plate cylinder and the impression cylinder did not take place and, even when a large force was applied upon dismounting the printing plate fixed with an adhesive double-coated tape from the plate cylinder with holding the portion of the cured resin layer after completion, the cured resin layer was not broken and tightly adhered to the support. Subsequently, this flexographic printing plate was stored under the condition of 40° C. for one month, again mounted on the printing machine, and printing was conducted, with no delamination between the cured resin layer and the support being observed.

In addition, no cracks were observed on the surface before, during and after printing, and good printing quality was maintained in the long-time printing.

On the other hand, in Comparative Example 1, reproducibility of extremely fine halftone dots was poor, and there was attained a reproduction of 3%-120 lines/inch at the best. In Comparative Example 2, tacky feeling remained after post exposure, and good printing products were not obtained due to extraneous matters remaining on the plate surface.

In addition, when the amount of post exposure using the sterilization lamp was increased to 1500 mJ/cm² in order to remove this tacky feeling, a number of cracks were formed on the plate surface with a slight stress though the tacky feeling was decreased to some extent.

COMPARATIVE EXAMPLE 3

A photosensitive constituent for flexographic printing plate was formed in the same manner as in Example 1 except for changing the liquid polybutadiene B-2000 to Polyoil 110 (made by Nihon Zeon; Mn=1600 and vinyl content=1 mol % according to catalogue data) and a flexographic printing plate was made in the same manner as in Example 1, but there was attained a reproduction of only 3%-120 lines/inch.

EXAMPLES 4 AND 5

70% of the thermoplastic elastomer used in Example 3, 20% of a liquid polybutadiene (B-2000; made by Nihon Sekiyu Kagaku) having a number average molecular weight of 2,000 and a vinyl content of 65 mol %, 7% of a monomer shown in Table 3, 1.0% of 2,2-dimethoxy-1,2-diphenylethan-1-one, 1.0% of 2-methyl-[4-methylthiophenyl]-2-morpholino-1-propanone and 1.0% of 2,6-di-t-butyl-p-cresol were kneaded in a kneader, sandwiched between the support used in Examples 1 to 3 and a 100-um thick, polyester-made cover sheet having a 4- to 6-μum polyamide layer. A pressure of 200 kg/cm$^2$ was applied thereto at 130° C. for 4 minutes by a press using a 3-mm spacer to form a photosensitive constituent for flexographic printing plate.

When this was processed in the same procedures as in Examples 1 to 3 to make a flexographic printing plate, the results shown in Table 3 were obtained. In every case, formation of extremely fine halftone dots of 1%-150 lines/inch was possible. The sample of Example 5 permitted a lessened amount of relief exposure and a short-time exposure in order to complete the exposure and, in addition, it was possible to form extremely fine halftone dots of 1%-175 lines/inch by giving a larger amount of relief exposure. In both Examples 4 and 5, the tacky feeling was removed by the post exposure of 1,200 to 2,000 mJ/cm$^2$ using the sterilization lamp, and no crackes were observed on the plate surface. Observation of the cross section of the relief image revealed that the shoulder was in an almost perpendicular shape, and printing quality was extremely good.

TABLE 3

| Monomer | Example 4 polyethylene glycol diacrylate (Light Ester 9EG, made by Kyouei Kagaku) | Example 5 nonane-diol di-acrylate |
|---|---|---|
| Relief Exposure | 9,000 mJ | 6,000 mJ |
| Amount Formability of Extremely | 1%-150 lines/inch | 1%-150 lines/inch |
| Fine Dots Tackiness of Plate | no | no |
| Surface Cracks Plate | no | no |
| Surface Printing Quality | good | good |

INDUSTRIAL APPLICABILITY

There are obtained good fine halftone dot-forming properties and printing quality in process printing. Tackiness of a plate surface can easily be removed, and cracks are difficult to be formed. At the same time, adhesion force between the photosensitive resin layer and the support of polyester film is enough strong not to cause troubles under actual printing conditions, and flexographic printing plates can be prepared which are stable over time.

What is claimed is:

1. A photosensitive constituent for a flexographic printing plate Comprising a polyester film as support (B) and a photosensitive elastomer composition (C) and having an adhesive layer (A) therebetween, wherein the photosensitive elastomer composition (C) comprises, as essential components, (a) 50% by weight or more of at least one thermoplastic elastomer comprising a mono-vinyl-substituted aromatic hydrocarbon and a conjugated diene, (b) 5 to 40% by weight of at least one diene-based liquid rubber, (c) 1 to 20% by weight of at least one ethylenically unsaturated compound having 2 unsaturated bonds within its molecule, and (d) 0.1 to 3% by weight of at least one photopolymerization initiator, wherein (1) the thermoplastic elastomer has an average ratio of vinyl bond units in conjugated diene segments thereof of 10 to 20 mol % and (2) the liquid rubber has a number average molecular weight (Mn) of 500 to 5,000 and an average ratio of vinyl bond units of 50 to 70 mol %, and wherein the ethylenically unsaturated compound (a) having 2 unsaturated bonds comprises a compound represented by formula

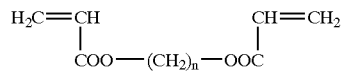

wherein n ranges from 9 to 16.

2. The photosensitive Constituent for a flexographic printing plate according to claim 1, wherein the average ratio of vinyl bond units in the conjugated diene segments of the thermoplastic elastomer is 14 to 20 mol %.

3. The photosensitive constituent for a flexographic printing plate according to claim 1 or 2, wherein said photopolymerization initiator (d) comprises a combination of 2,2-dimethoxy-1,2-diphenylethan-1-one and one of 2-methyl-1-[4-(methylthio) phenyl]-2-morpholinopropan-1-one and 2-benzyl-2-dimethylamino-1-(4-morpholinophenyl)-butanone-1.

4. The photosensitive constituent for a flexographic printing plate according to any one of claims 1 or 2 wherein the adhesive layer (A) is a reaction product between a mixture of a polyol having a polyester structure, a polyurethane structure, or both structures, and an ethylenically unsaturated compound containing a hydroxyl group, and a multi-functional isocyanate.

5. The photosensitive constituent for a flexographic printing plate according to claim 4, wherein the support (B) is a polyester film having laminated thereon an adhesive coating.

* * * * *